(12) United States Patent
Bickerstaff et al.

(10) Patent No.: US 7,107,509 B2
(45) Date of Patent: Sep. 12, 2006

(54) HIGHER RADIX LOG MAP PROCESSOR

(75) Inventors: Mark Andrew Bickerstaff, Carlingford (AU); Linda Mary Davis, Cowan (AU)

(73) Assignee: Lucent Technologies Inc., Murray Hill, NJ (US)

( * ) Notice: Subject to any disclaimer, the term of this patent is extended or adjusted under 35 U.S.C. 154(b) by 335 days.

(21) Appl. No.: 10/232,202

(22) Filed: Aug. 30, 2002

(65) Prior Publication Data

US 2004/0044946 A1    Mar. 4, 2004

(51) Int. Cl.
*H03M 13/45*    (2006.01)
(52) U.S. Cl. .................. 714/780; 714/792
(58) Field of Classification Search .......... 714/755, 714/780, 792
See application file for complete search history.

(56) References Cited

U.S. PATENT DOCUMENTS

| | | | |
|---|---|---|---|
| 5,933,462 A * | 8/1999 | Viterbi et al. ............ | 375/341 |
| 6,192,084 B1 * | 2/2001 | Miyauchi et al. .......... | 375/262 |
| 6,366,624 B1 * | 4/2002 | Balachandran et al. ..... | 375/341 |
| 6,400,290 B1 * | 6/2002 | Langhammer et al. ...... | 341/94 |
| 6,473,878 B1 * | 10/2002 | Wei ..................... | 714/755 |
| 6,484,283 B1 * | 11/2002 | Stephen et al. ........... | 714/786 |
| 6,516,437 B1 * | 2/2003 | Van Stralen et al. ....... | 714/755 |
| 6,516,444 B1 * | 2/2003 | Maru .................... | 714/795 |
| 6,563,877 B1 * | 3/2003 | Yamagiwa et al. ......... | 375/242 |
| 6,725,409 B1 * | 4/2004 | Wolf .................... | 714/755 |
| 6,760,390 B1 * | 7/2004 | Desai et al. ............. | 375/341 |
| 6,807,238 B1 * | 10/2004 | Rhee et al. .............. | 375/340 |
| 6,816,556 B1 * | 11/2004 | Kim ..................... | 375/265 |
| 6,865,711 B1 * | 3/2005 | Arad et al. .............. | 714/796 |
| 6,877,125 B1 * | 4/2005 | Le Bars et al. ............ | 714/755 |
| 2002/0048329 A1 * | 4/2002 | Tran et al. ............... | 375/340 |
| 2002/0053061 A1 | 5/2002 | Kong et al. | |

FOREIGN PATENT DOCUMENTS

EP    1 154 578 A    11/2004

OTHER PUBLICATIONS

Miyauchi, T., et al., "High-Performance Programmable SISO Decoder VLSI Implementation for Decoding Turbo Codes", IEEE Globecom '01, pp. 305-309.*

Raghupathy A et al: "A transformation for computational latency reduction in turbo-MAP decoding"Circuits and Systems, 1999. ISCAS '99. Proceedings of the 1999 IEEE International Symposium on Orlando, FL, USA May 30 - Jun. 2, 1999, Piscataway, NJ, USA, IEEE, US, May 30, 1999, pp. 402-405, XP010341252 ISBN: 0-7803-5471-0.

Pietrobon S S: "Implementation and Performance of a Turbo/MAP Decoder" International Journal of Satellite Communications, John Wiley and Sons, US, vol. 16, No. 1, 1998, pp. 23-46, XP000856961 ISSN: 0737-2884.

Gierenz V S et al: "A 550 Mb/s radix-4 bit-level pipelined 16-state 0.25-/spl mu/m CMOS viterbi decoder" IEEE International Conference on Application-Specific Systems, Architectures and Processors, Jul. 10, 2000, pp. 195-201, XP010507749.

(Continued)

*Primary Examiner*—Stephen M. Baker

(57) ABSTRACT

A Log Map processor that processes information in accordance with the Log MAP algorithm using an N-state Radix-K trellis where K is an integer equal to 4 or greater and N is an integer equal to 2 or greater. The Log Map processor comprises branch and path metric calculators designed with LogSum operators. The LogSum operators used and Add-Compare-Select architecture that is based on an approximation of the Jacobian definition of the LogSum operation. The Log Map processor is thus able to process relatively more information per unit time.

14 Claims, 11 Drawing Sheets

OTHER PUBLICATIONS

Masera G et al: "VLSI architectures for turbo codes" IEEE Transactions on Very Large Scale Integration (VLSI) Systems, IEEE Inc. New York, US, vol. 7, No. 3, Sep. 1999, pp. 369-379, XP002187339 ISSN: 1063-8210.

El-Assal M et al: "A high speed architecture for map decoder" IEEE Workshop on Signal Processing Systems, 2002. (SIPS '02), Oct. 16, 2002, pp. 69-74, XP010616579.

Bickerstaff M et al: "A 24Mb/s radix-4 LogMAP turbo decoder for 3 GPP-HSDPA A mobile wireless" Regular Paper ISSCC, XX, XX, Feb. 9, 2003, pp. 1-10, XP010661378.

Fettweis G et al: "Feedforward Architectures for Parallel Viterbi Decoding" Journal of VLSI Signal Processing Systems for Signal, Image, and Video Technology, Kluwer Academic Publishers, Dordrecht, NL, vol. 3, No. 1 / 2, Jun. 1, 1991, pp. 105-119, XP000228897 ISSN: 0922-5773.

Viterbi A J: "An Intuitive Justification and a Simplified Implementation of the Map Decoder for Convolutional Codes" IEEE Journal on Selected Areas in Communications, IEEE Inc. New York, US, vol. 16, No. 2, Feb. 1, 1998, pp. 260-264, XP000741780 ISSN: 0733-8716.

Erfanian J A et al: "Low-complexity parallel-structure symbol-by-symbol detection for ISI channels" IEEE Pacific Rim Conference on Communications, Computers and Signal Processing, Jun. 1, 1989, pp. 350-353, XP010084397.

* cited by examiner

HIGHER RADIX LOG MAP PROCESSOR

BACKGROUND OF THE INVENTION

1. Field of the Invention

The present invention generally relates to communication systems.

2. DESCRIPTION OF THE RELATED ART

A Log MAP (Maximum A Posteriori) processor processes information in accordance with the Log MAP algorithm. The Log MAP processor is usually part of a communication system that receives information which is to be decoded after such information has been exposed to noisy environments. The Log Map algorithm is a recursive algorithm for calculating the probability of a processing device being in a particular state at a given time based on received information. The probabilities are calculated by forward recursions and backward recursions over a defined time window or a block of information. The Log Map algorithm essentially is the recursive calculation of probabilities of being in certain states based on received information and the a priori probabilities of going to specific states from particular states. The states describe the condition of a process that generates the information that is ultimately received. The output of the Log MAP algorithm is called the LLR (Log Likelihood Ratio) which represents the probability that the original information (i.e., information prior to exposure to any noisy environment and prior to any processing) was a certain value. For example, for digital information, the LLR represents the probability that the original information was either a "0" bit or a "1" bit given all of the received data or observations. The Log MAP processor is a Soft Input Soft Output (SISO) device.

A SISO device receives soft information, processes such information in accordance with a particular algorithm or processing method and outputs soft information that can be used to make a hard decision about the received information or can be used for further processing. The soft information is probability data on the received information where such data give an indication of the confidence that is to be attributed to the value of the received information. For example, if received information was decoded to be a "0" bit, the soft information associated with that received information gives an indication of how likely that the original information was indeed a "0" bit. The SISO device also generates additional soft information as it is processing the input information; the difference between the additional generated soft information and the soft information at the input is called extrinsic information. In many applications where a SISO device is used, the extrinsic information is recursively inputted as soft input information to allow the SISO to generate more reliable soft information about a particular received information.

In processing digital information, a SISO device that employs the Log MAP algorithm (i.e., a Log MAP processor) processes the received information one bit at a time. The Log MAP algorithm and how the Log MAP processor operates are often represented by a trellis which has a certain number of states. Each state has a probability associated with it and transition probabilities indicating the likelihood of transitioning from one state to another state either forward or backward in time. Referring to FIG. 7, there is shown a portion of a trellis for a Log MAP processor; the trellis shows the possible transitions between states over time. Note that $\alpha_t^j$, which is called a forward path metric, represents the probability of being in state j at time t for a forward recursion and $\beta_t^j$, which is called a backward path metric, also represents the probability of being in state j at time t given the received information. Also note that $$\gamma_t^{j,k},$$

which is called a branch metric, is the probability of observing the received information given the transition from state i to state k and arriving at state k at time t. Although at most only two states are shown for each of the time instants, FIG. 7 can be, for example, an 8 state Radix-2 trellis where there are 8 states at each particular time instant representing the condition of the Log MAP processor. FIG. 7 is called a Radix-2 trellis because each state has two transition probabilities entering it and two transition probabilities leaving it. Thus, in general a radix-K trellis has K branches entering and K branches leaving each state in the trellis.

As communication systems have developed and as other systems that use Log MAP processors have developed, a need has emerged to process more information per unit time. For example, such communication systems or communication system components as turbo decoders or equalizers often use Log MAP processors as key components. In order to have communication systems with increased capacity and/or throughput, these key components have to process received information at relatively faster rates. Accordingly, there is a need to have Log MAP processors that can process information fast enough to meet the demands of the latest communication systems. In many applications, the Log MAP processing is implemented with the use of software. Generally, software implementations are inherently slower than hardware implementations of the Log MAP algorithm because of the time needed to execute software instructions within a processor or processing system. Indeed when the amount of processing per unit time is increasing, many times a software implemented algorithm becomes cannot be modified (i.e., reducing the number of instructions) sufficiently to meet the processing demand. In hardware implementations, the required hardware needed to increase the processing time often is complicated and costly because typically more components are added to perform the processing in parallel. What is therefore needed is a Log MAP processor that can process more information per unit of time than a Radix-2 Log MAP processor and avoids the limitations of software and hardware implementations.

SUMMARY OF THE INVENTION

The method and apparatus of the present invention provides a Log MAP processor that processes information in accordance with a Log MAP algorithm using a Radix-K N-state trellis where N is an integer equal to 2 or greater and K is an integer equal to 4 or greater. The Radix-K N-state trellis is a higher radix trellis that enables the Log MAP processor of the present invention to process relatively more information per unit time. The Log MAP processor has N states as defined by the trellis and each of the N states can transition to or from any one of K states as defined by the forward and backward path metrics and the branch metrics of the trellis. The forward path metrics are calculated as per a recursive formulation that uses previously calculated forward path metrics and branch metrics. Similarly, the backward path metrics are calculated as per a recursive formulation that uses previously calculated backward path metrics and branch metrics.

The Log MAP processor is a SISO device that comprises a Branch Metric Calculator (BMC) which calculates branch metrics as per the Log MAP algorithm for the N-state Radix-K processing procedure. The Log MAP processor further comprises forward and backward Path Metric Calculators (PMC) configured to receive the calculated branch metrics and configured to recursively calculate forward and backward path metrics which are fed to Log Likelihood (LL) calculators having at least two outputs. The PMCs are coupled to the Log Likelihood calculators. The Log Likelihood calculators use the calculated path metrics to calculate log likelihood values. The Log Likelihood calculators are coupled to subtracting circuits to calculate the difference between their outputs and an extrinsic information input resulting in a Log Likelihood Ratio (LLR) output of the Log MAP processor of the present invention. The extrinsic information input can be obtained as a previous output of the Log MAP processor or can be other soft information generated or received from elsewhere. The Path Metric Calculators and the Log Likelihood calculators are constructed with LogSum operators designed with an Add Compare Select (ACS) architecture. The ACS architecture is based on a definition of the LogSum operation called the Jacobian relationship; the ACS architecture uses an approximation of the Jacobian relationship.

DETAILED DESCRIPTION

Figure 1:
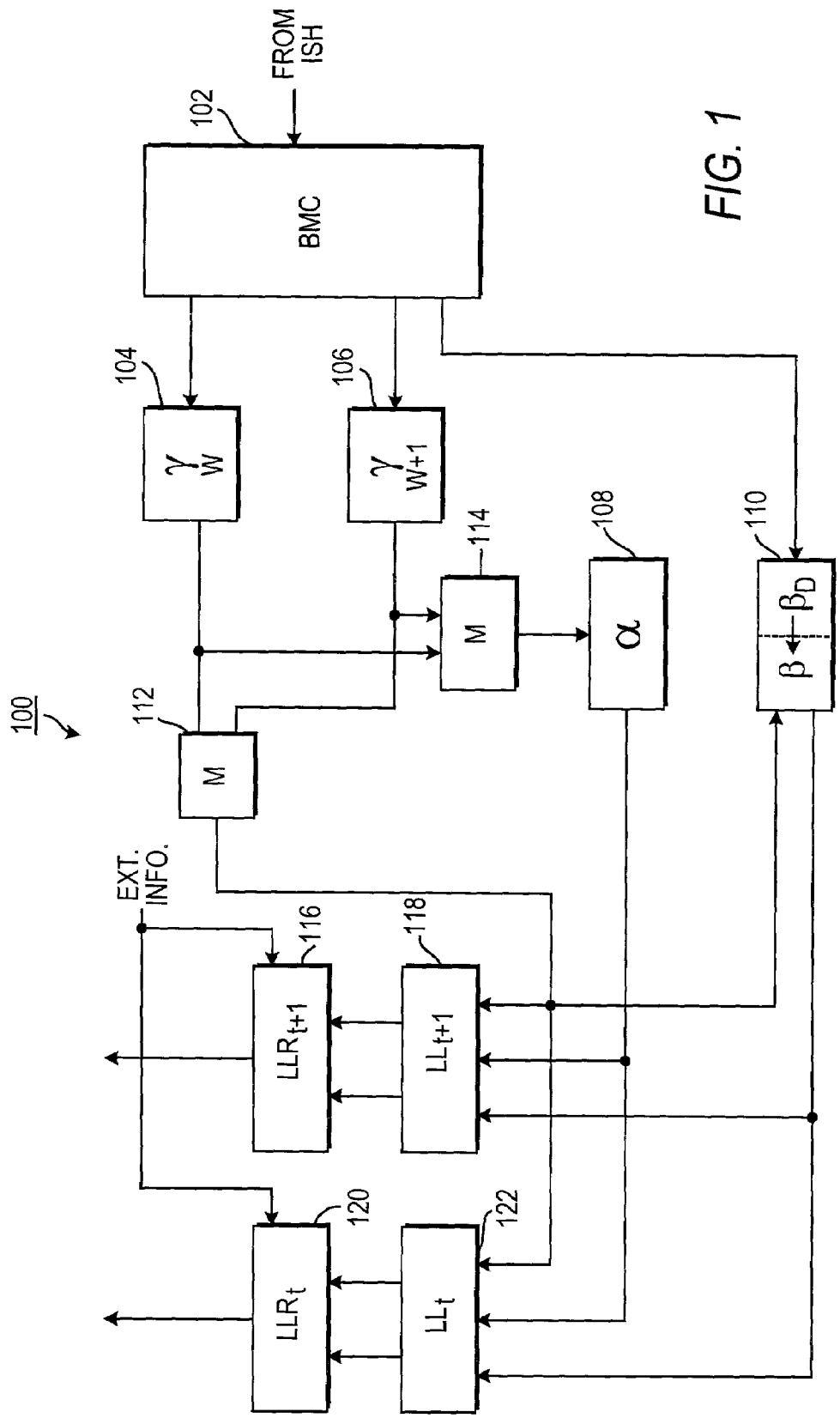
FIG. 1 is a block diagram of a Log MAP processor of the present invention.

The method and apparatus of the present invention provides a Log MAP processor that processes information in accordance with a Log MAP algorithm using a Radix-K N-state trellis where N is an integer equal to 2 or greater and K is an integer equal to 4 or greater. The Radix-K N-state trellis is a higher radix trellis that enables the Log MAP processor of the present invention to process relatively more information per unit time. The Log MAP processor has N states as defined by the trellis and each of the N states can transition to or from any one of K states as defined by the forward and backward path metrics and the branch metrics of the trellis. The forward path metrics are calculated as per a recursive formulation that uses previously calculated forward path metrics and branch metrics. Similarly, the backward path metrics are calculated as per a recursive formulation that uses previously calculated backward path metrics and branch metrics.

The Log MAP processor is a SISO device that comprises a Branch Metric Calculator (BMC) which calculates branch metrics as per the Log MAP algorithm for the N-state Radix-K processing procedure. The Log MAP processor further comprises forward and backward Path Metric Calculators (PMC) in communication with the BMC and configured to receive the calculated branch metrics and configured to recursively calculate forward and backward path metrics which are fed to Log Likelihood (LL) calculators having at least two outputs. The PMCs are coupled to the Log Likelihood calculators. The Log Likelihood calculators use the calculated path metrics to calculate log likelihood transition terms. The Log Likelihood calculators and an extrinsic information input resulting in a Log Likelihood Ratio (LLR) output of the Log MAP processor of the present invention. The extrinsic information input can be obtained as a previous output of the Log MAP processor or can be other soft information generated or received from elsewhere. The Path Metric Calculators and the Log Likelihood calculators are constructed with LogSum operators designed with an Add Compare Select (ACS) architecture. The ACS architecture is based on a definition of the LogSum operation called the Jacobian relationship; the ACS architecture uses an approximation of the Jacobian relationship.

The method and apparatus of the present invention are generally designed for an N-state Radix-K Log Map processor where N is an integer equal to 2 or greater and K is equal to 4 or greater. Received information is applied to the Radix-K Log MAP algorithm. An N-state Radix-K processing guide (i.e., a trellis) is thus provided on which the application of received information to the Log MAP algorithm is based. The branch and path metrics are processed as per the N-state Radix-K processing guide (i.e., a trellis). The calculation of the branch and path metrics may be expressed in terms of various equations depending on the particular values of K and N and depending on the type of information being processed. For example, when the information being processed is in digital form (i.e., binary data), the equations for the branch and path metrics will have specific forms. For illustration purposes only, the method and apparatus of the present invention will be described in the context of an 8-state Radix-4 trellis for processing digital information. The equations that follow are derived for the 8-state Radix-4 implementation of the present invention used to process digital information.

Referring to FIG. 1, there is shown the LogMap processor 100 of the present invention. The LogMAP processor is a SISO device configured with a BMC in communication with PMCs which are coupled to LL calculators whose outputs are used to generate the LLR outputs. In particular BMC 102 uses received information (i.e., received samples) stored in an Input Symbol History (ISH) buffer (not shown) to generate branch metrics (γ) in accordance with the following equation (rate $\frac{1}{2}$ systematic code):

$$\gamma_t^j = \frac{1}{2}((Y_{S_t} + L_{t,ext})E_{S_t}^{t,\phi_b(i)} + Y_{P_t}E_{S_t}^{t,\phi_b(i)}), \quad (1)$$

i=0, . . . , N; b=0,1 are binary bits and where $E_{S_t}^{i,\Phi_b(t)}$ is the expected value of a received systematic sample at time t for a hypothesis (supposed decision or "guess" on the value of the original information) corresponding to a transition from state i to state $\phi_b(i)$;

$$E_{P_t}^{t,\phi_b(i)}$$

is the expected value of a received parity sample at time t for a hypothesis corresponding to a transition from state i to state $\phi_b(i)$. $L_{t,ext}$ is extrinsic information associated with the received samples; $L_{t,ext}$ can be, for example, a previous output of the LogMAP processor of the present invention. In general, the notation $\phi_b(i)$ can represent the next state after a "0" transition (i.e., $\phi_0(i)$) or the next state after a "1" transition, i.e., $\phi_1(i)$. Also, $\phi_0^{-1}(j)$ denotes the previous state for a "0" transition into state j and $\phi_1^{-1}(j)$ denotes the previous state for a "1" transition into state j. $Y_P$ represents received parity information, i.e., information used for error correction and detection. $Y_{S_t}$ represents received systematic samples, i.e., received information. It should be noted that for the Radix-4 8-state example, BMC 102 contains 8 BMC calculating units. The calculating units comprise typical digital hardware for calculating the branch metrics as per equation (1).

It should be noted that generally the branch metric is a measure of proximity of the received information relative to what is expected. The branch metrics are calculated for a stream of information partitioned into time windows. The current time window is W time units in length where W is an integer. The next window can also be W time units in length. The set of branch metrics calculated during the current window is stored in memory 104 and the next set of branch metrics for the next window is stored in memory 106. The outputs of memories 104 and 106 are fed to multiplexer 114 which routes one or the other output to forward path metric calculator 108 depending on which time window is being processed. Memories 104 and 106 are preferably dual port memories which allow data to be read in one or more locations while data is being retrieved from one or more other locations for the same memory. For example, for one memory branch metrics for a current window are being retrieved from the memory while branch metrics for another window are being inserted into the memory; simultaneously for the other memory, branch metrics for the current window are being transferred and branch metrics for the other window are being inserted. Then for a subsequent window the roles of the memories are reversed thus causing a "ping-pong" effect in the insertion and/or retrieval of branch metrics to or from the memories. Generally, a multiplexer is a circuit that more than one input and routes one of the inputs to its output based on a control signal applied to its one or more select inputs.

Although not shown, it is understood that forward path metric calculator 108 has various temporary locations where the different branch metrics are stored to be used to calculate the forward branch metrics, α. The output of BMC 102 is also fed to backward path metric calculator 110. As with forward PMC 108, backward PMC 110 has various temporary locations where backward path metrics for time window W, i.e., β, and backward path metrics for the next time window, i.e., $\beta_D$, are stored. The forward PMC 108 and the backward PMC 110 are thus in communication with BMC 102 meaning that information is conveyed (i.e., received and/or transmit) between BMC 102 and the PMCs. The forward and backward path metrics for radix-4 are calculated per the following equations:

$$\alpha_t^j = \log sum \left( \left( \alpha_{t-2}^{\phi_0^{-1}(\phi_0^{-1}(j))} + \gamma_{t-1}^{\phi_0^{-1}(\phi_0^{-1}(j)),\phi_0^{-1}(j)} + \gamma_t^{\phi_0^{-1}(j),j} \right), \right. \quad (2)$$
$$\left( \alpha_{t-2}^{\phi_1^{-1}(\phi_0^{-1}(j))} + \gamma_{t-1}^{\phi_1^{-1}(\phi_0^{-1}(j)),\phi_0^{-1}(j)} + \gamma_t^{\phi_0^{-1}(j),j} \right),$$
$$\left( \alpha_{t-2}^{\phi_0^{-1}(\phi_1^{-1}(j))} + \gamma_{t-1}^{\phi_0^{-1}(\phi_1^{-1}(j)),\phi_1^{-1}(j)} + \gamma_t^{\phi_1^{-1}(j),j} \right),$$
$$\left. \left( \alpha_{t-2}^{\phi_1^{-1}(\phi_1^{-1}(j))} + \gamma_{t-1}^{\phi_1^{-1}(\phi_1^{-1}(j)),\phi_1^{-1}(j)} + \gamma_t^{\phi_1^{-1}(j),j} \right) \right)$$

$$\beta_t^i = \log sum \left( (\beta_{t+2}^{\phi_0(\phi_0(i))} + \gamma_{t+1}^{i,\phi_0(i)} + \gamma_{t+2}^{\phi_0(i),\phi_0(\phi_0(i))}), \right. \quad (3)$$
$$(\beta_{t+2}^{\phi_1(\phi_0(i))} + \gamma_{t+1}^{i,\phi_0(i)} + \gamma_{t+2}^{\phi_0(i),\phi_1(\phi_0(i))}),$$
$$(\beta_{t+2}^{\phi_0(\phi_1(i))} + \gamma_{t+1}^{i,\phi_1(i)} + \gamma_{t+2}^{\phi_1(i),\phi_0(\phi_1(i))}),$$
$$\left. (\beta_{t+2}^{\phi_1(\phi_1(i))} + \gamma_{t+1}^{i,\phi_1(i)} + \gamma_{t+2}^{\phi_1(i),\phi_1(\phi_1(i))}) \right)$$

Figure 2:
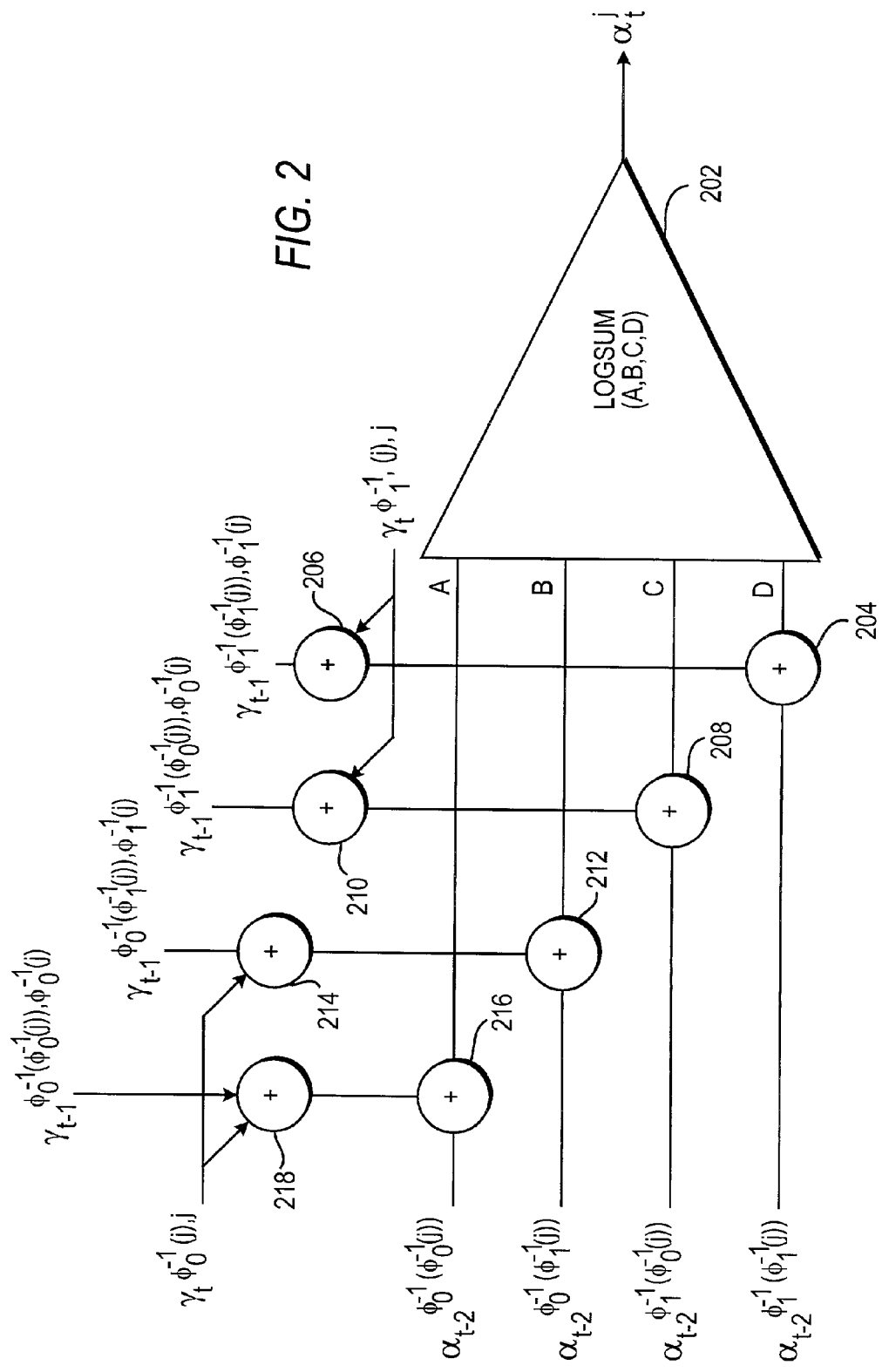
FIG. 2 shows a path metric calculator for a forward path metric for an 8-state Radix-4 Log MAP processor.

Again, equations (2) and (3) are used for the 8-state Radix-4 implementation of a Log MAP processor of the present invention designed to process digital information. Referring momentarily to FIG. 2, there is shown a path metric calculator comprising adders 204, 206, 208, 210, 212, 214, 216 and 218 and a 4-input LogSum operator 202 for calculating a forward path metric as per equation (2) above. A similar path metric calculator is used for the calculation of a backward path metric as per equation (3) above. LogSum operator 202 logarithmically combines all of the sums from adders 204-218. In general LogSum operators 202 performs an arithmetic operation on its inputs that can be defined by the following relationship:

LogSum($A_1, A_2, A_3, \ldots$)=max($A_1, A_2, A_3, \ldots$)+f($A_1, A_2, A_3, \ldots$) where f($A_1, A_2, A_3, \ldots$)=log(exp($-\Delta_1$)+exp($-\Delta_2$)+exp($-\Delta_3$)+ . . . ) and where $\Delta_i$=$A_i$-min($A_1, A_2, A_3, \ldots$).

The above definition of the LogSum operation is referred to as a Jacobian relationship, Erfanian, J., Pasupathy, S. and Gulak, G.: "*Reduced Complexity Symbol Detectors with Parallel Structures for ISI Channels*", IEEE Transactions on Communications, vol. 42, no. 2/3/4. pp. 1661-1671, February/March/April 1994.

Figure 6:
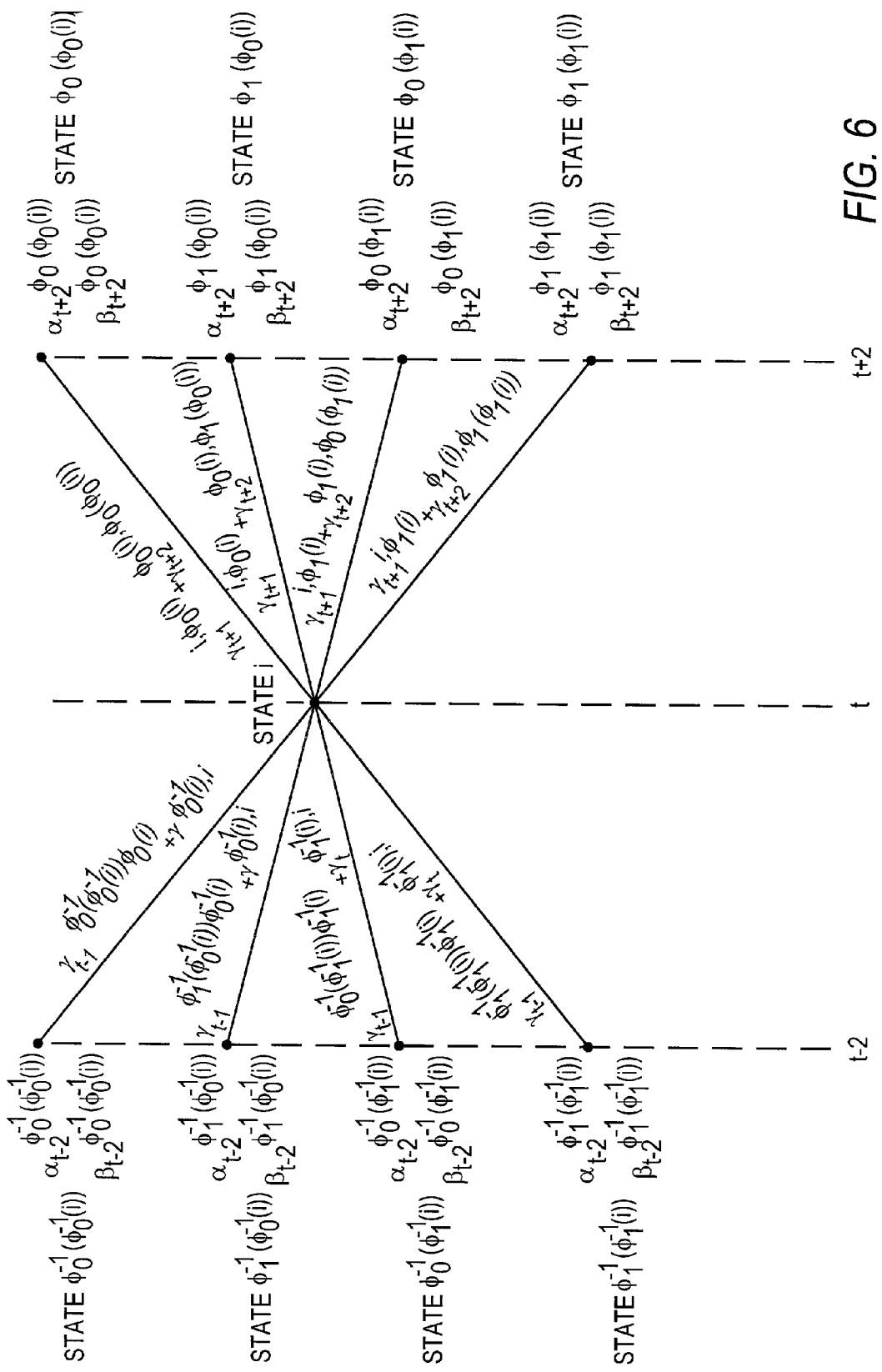
FIG. 6 depicts a portion of an 8-state Radix-4 trellis as per the Log MAP algorithm with branch metrics and path metrics calculated in accordance with the Log MAP algorithm.
Figure 7:
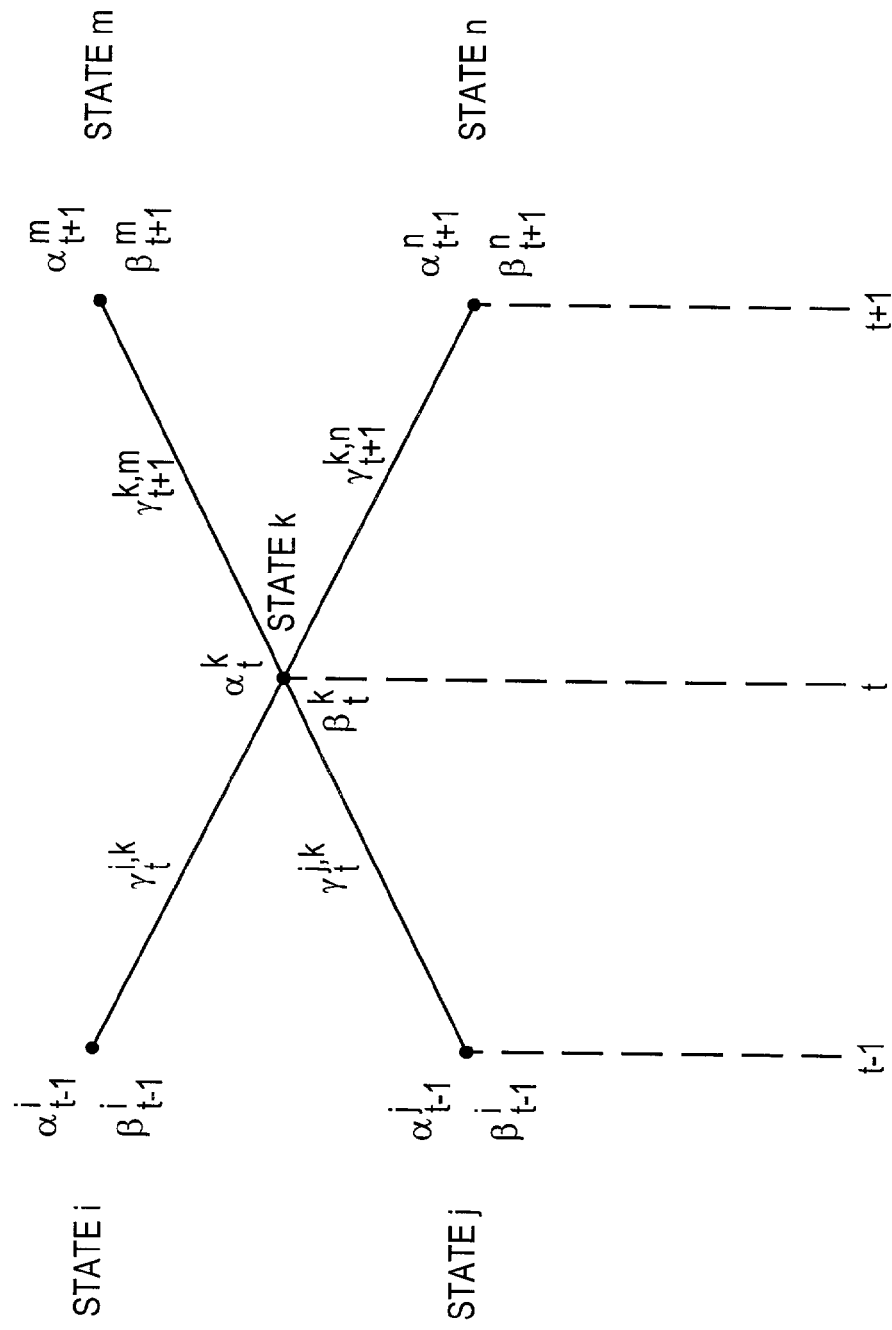
FIG. 7 depicts a portion of a radix-2 trellis used in a Log MAP algorithm.

Referring momentarily to FIG. 6, there is shown a portion of a radix-4 N-state trellis that shows how the Log MAP processor of the present invention transitions forward from time t-2 from any one of four states to state i at time t and how the LogMAP processor of the present invention transitions backward from time t-2 from any one of four states to state i at time t in accordance with equations (2) and (3) respectively.

Figure 4:
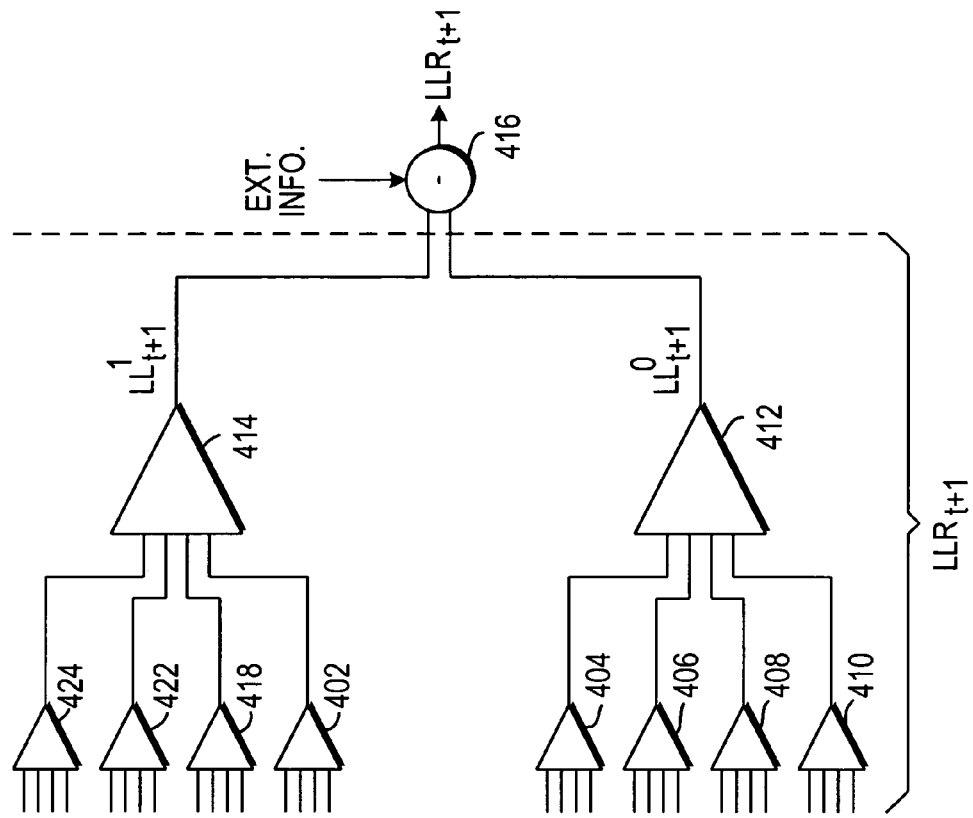
FIG. 4 shows an implementation of the Log Likelihood calculators of FIG. 1 using LogSum operators.
Figure 4:
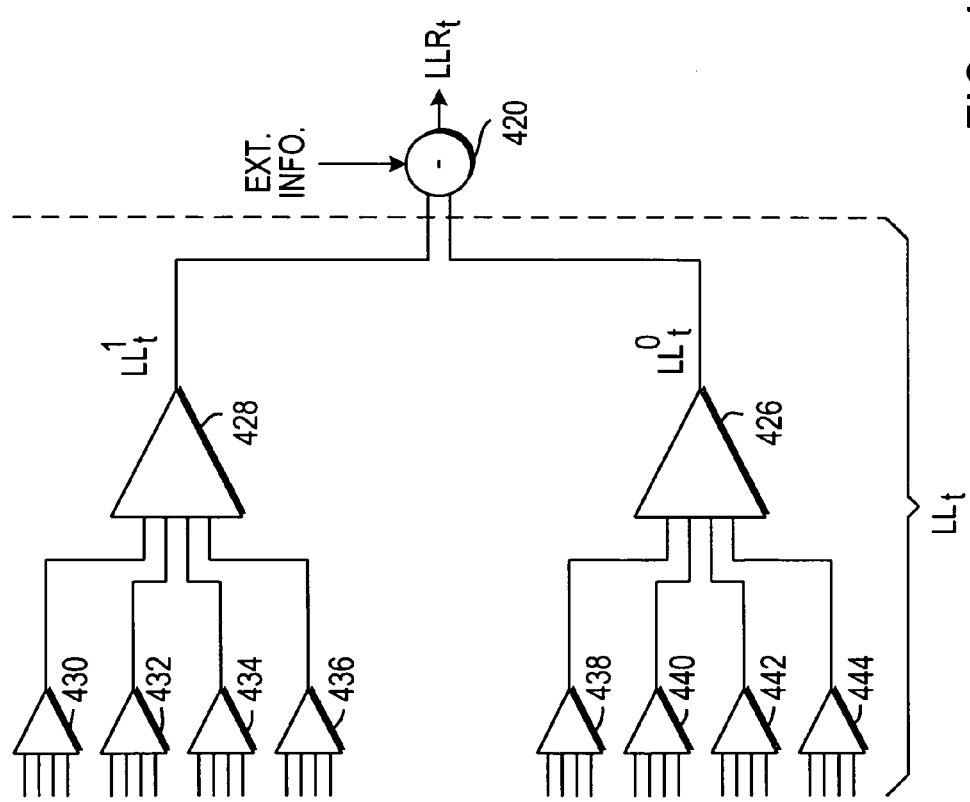

Referring back to FIG. 1, the calculated branch metrics and path metrics (backward and forward) are transferred to Log Likelihood (LL) calculators 122 and 118 which calculate Log Likelihood values. Depending on which time window is being processed, multiplexer 112 will route branch metrics from either memory 104 or 106 to Log Likelihood calculator 122. Referring momentarily to FIG. 4, there is shown the architecture for each of the Log Likelihood calculators. It should be noted that because a radix-4

Log MAP processor is being discussed, there are two Log Likelihood calculators. As stated earlier, the present invention is certainly not limited a radix-4 implementation and thus the number of Log Likelihood calculators can change depending on the value of K for a Radix-K Log MAP processor of the present invention. For example, for a Radix-8 Log MAP processor, there are 3 LL calculators(each of which has 16 inputs) and for a Radix-16 Log MAP processor there are 4 LL calculators (each of which has 32 inputs). For ease of explanation and illustration only, the Radix-4 implementation is discussed in detail. The LL calculators (118, 122) of the Log MAP processor are shown to be constructed with LogSum operators. For LL 122, there are eight 4-input LogSum operators (430, 432, 434, 436, 438, 440, 442 and 444). The outputs of the first four Logsum operators (i.e., 430–436) are coupled to a 4-input aggregate LogSum operator 428. The remaining four LogSum operators have their outputs coupled to another aggregate LogSum operator 426. The difference between the log likelihood values at the outputs of the aggregate LogSum operators and extrinsic information input is performed by a subtractor circuit. Thus LLR 120 of FIG. 1 is the subtractor circuit 420 shown in FIG. 4. In other words, the Log Likelihood ratio at time t is provided by subtractor 420.

As with LL 122, LL 118 of FIG. 1 comprises eight LogSum operators (424, 422, 418, 402, 404, 406, 408 and 410 shown in FIG. 4) where the first four LogSum operators (424, 422, 418 and 402) are coupled to aggregate LogSum operators 414 and the remaining LogSum operators (404, 406, 408 and 410) are coupled to aggregate LogSum operator 412. The difference between the outputs of the aggregate Logsum operators and an extrinsic information input is performed by a subtractor circuit 416. Thus, LLR 116 of FIG. 1 is the subtractor 416 shown in FIG. 4. Depending on the application, the extrinsic information input can be from previous LLR outputs of the LogMAP processor or soft information from elsewhere.

The LL calculators logarithmically combine the path metrics (backward and forward) and branch metric results to calculate the log likelihood values. Referring to FIG. 5 momentarily, each of the LL calculators has two outputs. One output represents the contributions (from the branch and path metrics) to the information bit being a "1", i.e., output of logsum operator 428 for LL, and output of logsum operator 414 for $LL_{t+1}$. The other output represent the contributions to information bit being a "0", i.e., output of logsum operator 426 for LL, and output of logsum operator 412 for $LL_{t+1}$. For a Radix-4 Log MAP processor, the trellis shows that the branch metrics traverse two time units when going from one state to another state; this represents a time compression with respect to a radix 2 trellis. That is, as shown in FIG. 5, the processor transitions from time t to time t+2; the state of the processor at time t+1 is not shown. However, to calculate the LL values, the contributions by the path and branch metrics for every time transition is to be included. It would thus seem that for a Radix-4 (or Radix-K where K is 4 or greater) case some type of interpolation is needed to calculate the metrics at the time instants that do not appear in the trellis. However, judicious selection of the branch metrics for the higher Radix trellis (i.e., Radix-K where K is 4 or greater) eliminates the need for interpolation calculations; this is shown and explained in FIG. 4A.

Figure 4A:
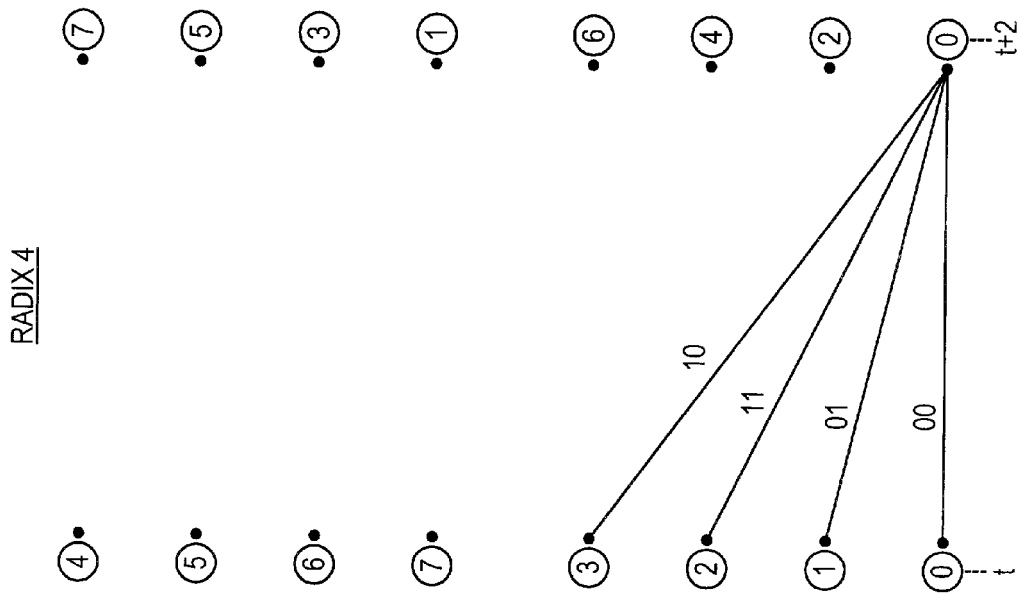
FIG. 4A shows part of a mapping between a Radix-2 trellis and a Radix-4 trellis.
Figure 4A:
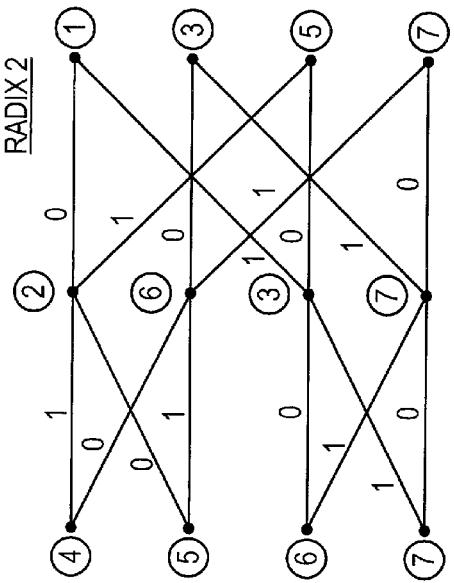
Figure 4A:
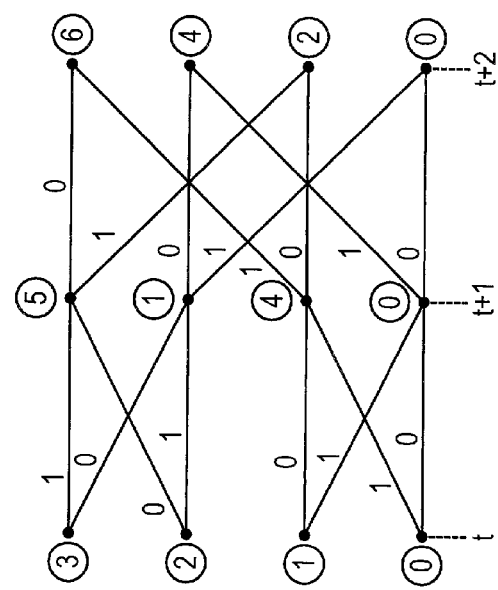
Figure 5:
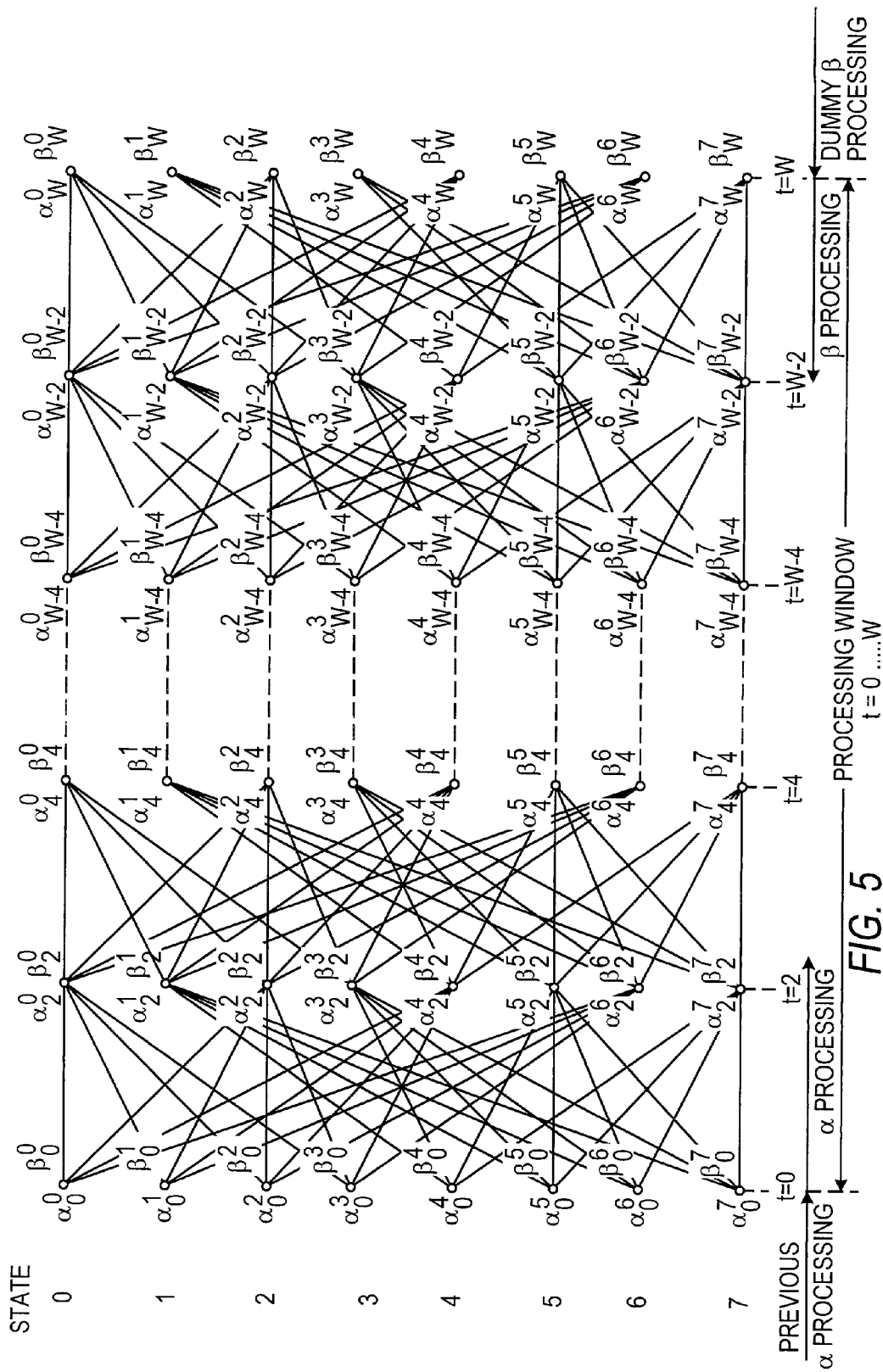
FIG. 5 depicts an 8-state Radix-4 trellis used by Log MAP processor of FIG. 1.

Referring to FIG. 4A, there is shown an 8-state radix-2 trellis and an 8-state radix-4 trellis. For the radix-2 trellis each of the branches has an information bit associated with it. In other words, the branches that are labeled with a "0" are the contributing to the information bit being a "0". The branches that are labeled with a "1" are contributing to the information bit being a "1". The Radix-4 trellis also has 8 states with only the branches entering state 0 shown for ease of explanation and clarity of illustration. As with the Radix-2 trellis, each branch in the Radix-4 has information bits associated with it. However, the information is a 2-bit information and therefore the particular information associated with a particular branch is obtained from a mapping of a Radix-2 trellis to a Radix-4 trellis. For example, the transition from state 3 to state 0 (from time t to time t+2) is shown to be associated with the bit pattern 10. The bit pattern 10 is obtained by observing the bottom portion of the Radix-2 trellis from which two transitions for going from state 3 to state 0 can be determined. The first transition (from t to t+1) is from state 3 to state 1 (associated information bit is "0") and then the next transition (from t+1 to t+2) is from state 1 to state 0 (associated information bit is "1"). The first transition is associated with the Least Significant Bit (LSB) and the second transition is associated with the Most Significant Bit (MSB) of the 2-bit pattern. The remaining three transitions shown entering state 0 of the Radix-4 trellis are obtained in a similar fashion. Therefore, because the radix-2 transitions and bit associations can be used to determine the information bit association for the branches of a radix-4 (or higher radix) trellis, the contributions of all of the branch metrics and path metrics to a particular information bit can be determined for higher radix trellises. Thus, certain branch metrics and path metrics transitions are grouped together to calculate all of the contributions to a particular information bit and thus determine the log likelihood value for that information bit. Referring to FIG. 4, for example, the contributions to a "0" bit in the LSB position for the Radix-4 processor are inputted into LogSum operators 438, 440, 442 and 444. The contributions to a "1" bit in the LSB position are inputted into LogSum operators 430, 432, 434, and 436. The contributions to a "1" bit in the MSB position are inputted into LogSum operators 424, 422, 418 and 402. Finally, the contributions to a "0" bit in the MSB position are inputted into LogSum operators 404, 406, 408, and 410. Therefore, the inputs of the LL calculators (118, 122) arranged in groups whereby each group represents selected branch and path metric calculations that contribute to a particular log likelihood value.

Figure 3:
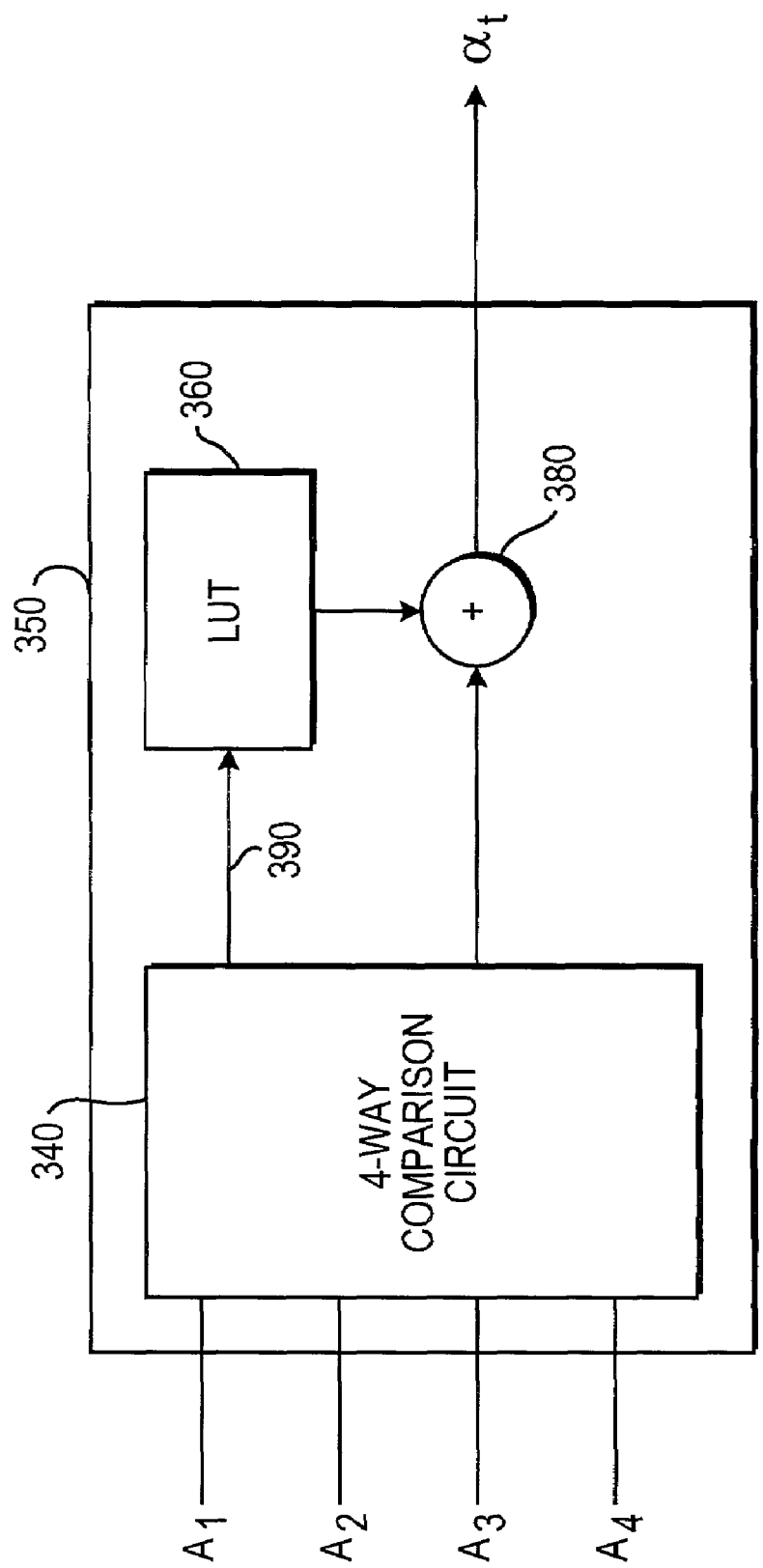
FIG. 3 shows the architecture of a LogSum operator based on an approximation of the LogSum operation.

As has been shown above, the Path Metric Calculators used to calculate the forward and backward path metrics and the LL calculators used to calculate the log likelihood values are constructed with LogSum operators. Referring momentarily to FIG. 3, there is shown the architecture for the LogSum operators depicted by FIG. 4. The Jacobian definition of the LogSum operation is replicated here for ease of reference:

LogSum($A_1, A_2, A_3 \ldots$)=max($A_1, A_2, A_3 \ldots$)+f($A_1, A_2, A_3, \ldots$) f($A_1, A_2, A_3, \ldots$)=log(exp($-\Delta_1$)+exp$-(\Delta_2)$+exp$(-\Delta_3)+ \ldots$) and where $\Delta_1 = A_i - \min(A_1, A_2, A_3 \ldots)$. The Logsum definition is approximated as follows: =max ($A_1, A_2, \ldots$)=f($|A_{max1} - A_{max2}|$)

$$LogSum = \max(A_1, A_2, \ldots) + f\left(\left|A_{\max_1} - A_{\max_2}\right|\right)$$

where $$A_{\max_1}$$

and $$A_{\max_2}$$

are the two largest values being considered by the LogSum operator at a particular time. The LogSum operators are designed using a particular architecture called an Add-Compare-Select (ACS) architecture that implements the approximation of the Jacobian definition of the LogSum operation. Still referring to FIG. 3, the results of the adders (not shown, see FIG. 2) at the input to LogSum operator 350 are fed to 4-way comparison circuit 340. Comparison circuit 340 outputs the two largest inputs (i.e., maximum and next maximum) of the four inputs. By sending the proper select control signal over path 390, comparison circuit 340 accesses the value $$f\left(\left|A_{\max_1} - A_{\max_2}\right|\right)$$

stored in Lookup Table (LUT) 360. Adder 380 sums the LUT value with the output of comparison circuit 340 thus resulting in a calculated branch or path metric.

Figure 3A:
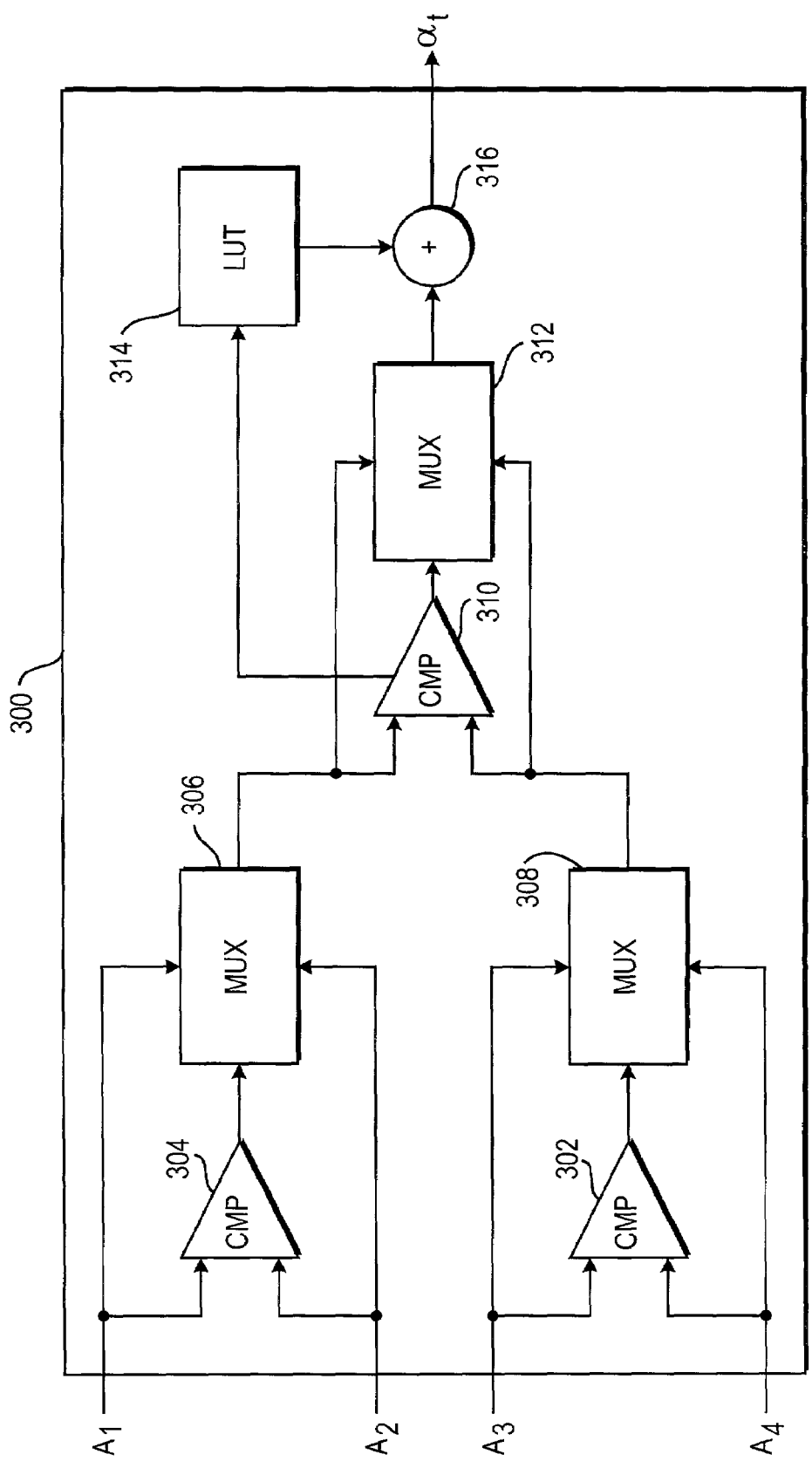
FIG. 3A shows another architecture of a LogSum operators also based an approximation of the LogSum operation.

Another implementation of the ACS architecture is shown in FIG. 3A. Referring now to FIG. 3A, the results of adders at the input of the LogSum operator 300 (not shown; see FIG. 2) are applied to comparators 304 and 302. The outputs of the comparators as well as the inputs are applied to multiplexers 306 and 308 as shown. The outputs of the multiplexers are again applied to a comparator 310 whose output along with the outputs of multiplexers 306 and 308 are applied to multiplexer 312. The values for $$f\left(\left|A_{\max_1} - A_{\max_2}\right|\right)$$

are stored in LUT 314. The outputs of multiplexer 312 and Lookup Table (LUT) 314 are added with adder 316 to form the final output of the LogSum operator. It is intended that comparators 304, 302 and 310 along with multiplexers 306, 308 and 312 find the two largest (i.e., maximum and next maximum) values among the four input values. However, because at most two of the inputs are being compared to each other at any time, the architecture in FIG. 3A will yield the maximum value among the four inputs but not necessarily the next maximum value. Therefore, the implementation shown in FIG. 3A reduces the accuracy of the calculated metric and thus adversely affects the performance of the LogMAP processor. As will be shown later the degradation in performance is negligible and thus the architecture shown in FIG. 3A can also be used to construct the LogSum operators.

Note the output of LogSum operator 428 represents the probability that a "1" bit was received at time t; the output of Logsum operator 426 represent the probability that a "0" bit was received at time t. Similarly the outputs of LogSum operators 414 and 412 represent the probability that a "1" and a "0" bit were received at time t+1 respectively.

Referring now to FIG. 5, there is shown an 8-state Radix-4 trellis representing how the LogMAP processor of the present invention processes incoming information to generate the branch metrics and use such branch metrics to calculate the forward and backward path metrics. The processing window is W time units in length and note that the odd time instants (t=1, 3, 5, . . . ) are not shown. Also for clarity of illustration, the branch metrics for each of the transitions are not shown. It will be understood, however, that the branch metrics and path metrics are calculated according to equations (1), (2) and (3) above. The forward recursion starts at time t=0 and is initialized using the forward path metrics at the end of the previous window. The forward and backward processing are done for a block of information occurring during a time window of W times units as shown.

Each state in the Radix-4 trellis has four branches entering it and four branches emanating from it. The trellis is compressed in time because a transition from one state to another state encompasses two information bits as compared to one information bit for the Radix-2 trellis. Therefore, for a Radix-4 trellis, the LogMAP processor of the present invention processes two bits at a time and has two LLR outputs corresponding to the two bits. Accordingly, for a Radix-8 trellis (not shown), the transition from one state to another state encompasses three information bits. For a Radix-16 trellis (not shown), a transition from one state to another state encompasses four information bits. Thus, generally for a Radix-K trellis where K is equal to 4 or greater, a transition from one state to another encompasses $\log_2 K$ information bits. As the LogMAP processor is transitioning from one state to another state starting at time t=0 to time t=W, it is processing the forward path metrics and the branch metrics as per equations (1) and (2). At time t=W, the forward recursion stops and the backward recursion starts. Dummy backward path metrics from the next window are used to initialize the backward recursion in time window W. In other words, the backward recursion actually starts from part of the next window.

Referring to FIGS. 1 and 5, at time t=0 the forward recursion starts for window W. The calculated branch metrics are stored in memory 104 and are transferred from memory 104 via multiplexer 114 to PMC 108 at the proper time instants. The forward path metrics calculated by PMC 108 are transferred to LL calculators 118 and 122. Also, the branch metrics from memory 104 are transferred via multiplexer 112 to LL 118 and 122 and PMC 110. Thus LL 122 and 118 are in communication with BMC 102 meaning that information is conveyed (i.e., received and/or transmit) between the LLs and BMC 102. At time t=W, branch metrics from BMC 102 are transferred to PMC 110 to allow PMC 110 to calculate the dummy backward path metrics, $\beta_D$; that is, initially branch metrics from the next window are first transferred to PMC 110 to allow PMC 110 to calculate the $\beta_D$'s. Another approach is that the $\beta_D$'s could have been prestored in BMC 102 and transferred to PMC 110 at time t=W. PMC 110 has different memory locations for storing the calculated dummy backward path metrics (i.e., $\beta_D$) and for storing the other backward path metrics (i.e., $\beta$). The two types of backward path metrics are then transferred to LL 118 and 122. At the next time window, the branch metrics from memory 106 are transferred to LL calculators 118 and 122 and PMC 110 via multiplexer 112. The branch metrics from memory 106 are also transferred to forward PMC 108 and LL calculators 118 and 122 via multiplexer 114. The path metrics are calculated in the same manner as the previous window.

Referring now to FIG. 1 only, the LL calculators 118 and 122 logarithmically combine the path metrics and the branch metrics as per the LogSum operation to generate log likelihood values. Thus, two information bits can be determined (for each trellis time from t to t+2) from the outputs of the Radix-4 Log MAP processor discussed above. Thus, a turbo decoder constructed with Log MAP processors of the present invention are able to process relatively more information per unit time than radix-2 turbo decoders. It should be noted that in general for an N-state Radix-K Log MAP processor, there are a total of $4\log_2 K$ BMC operators, $\log_2 K$ PMCs, $\log_2 K$ BMCs and the number of PMC's remain the same. Although the number of PMCs remain the same, the complexity of the PMCs increases as K increases.

Because the higher radix LogMAP processor of the present invention can process relatively more information per unit time, many applications that use LogMAP processors can now benefit from the device of the present invention. For example, turbo decoders and channel equalizers use SISO devices such as the LogMAP processor of the present invention to decode received information that has been exposed to various anomalies of a communication channel.

Figure 8:
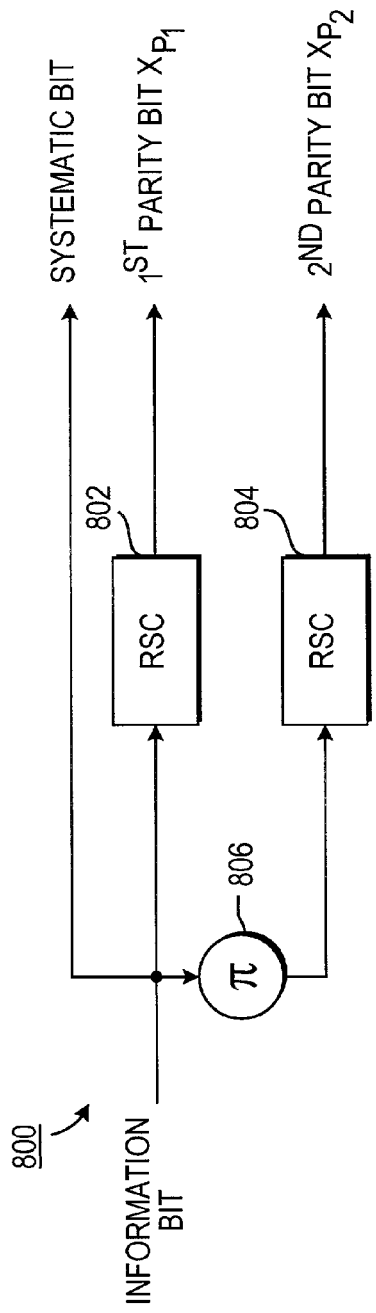
FIG. 8 is a block diagram of a turbo encoder.

A turbo decoder is a device that is used to decode information that has been encoded by a turbo encoder and possibly has been processed by other coding devices. Referring to FIG. 8, there is shown an example of a turbo encoder 800 comprising Recursive Systematic Coders (RSC) 802 and 804 and interleaver 806. Interleaver 806 perform well known interleaving operations on its input and outputs its result to RSC 804. Interleaving is the alteration in time of a stream of information bits, i.e., changing the time order of information bits. Both RSC 102 and 104 perform coding operations on the information bits and the interleaved information bits respectively. RSC 102 and 104 generate parity bits $X_{P_1}$ and $X_{P_2}$ respectively as a result of their coding operations. Also, each information bit is essentially replicated and is called the systematic bit (i.e., $X_S$). The $X_{P_1}$ and $X_{P_2}$ parity bits and the systematic bit are transmitted over a communication channel that typically has channel anomalies such as amplitude fading and phase jitter and thermal noise at the receiver front end. The channel anomalies introduce error in the transmitted information. The received parity bits become $Y_{P_1}$ and $Y_{P_2}$ and the systematic bit becomes $Y_S$ and are referred to as samples.

Figure 9:
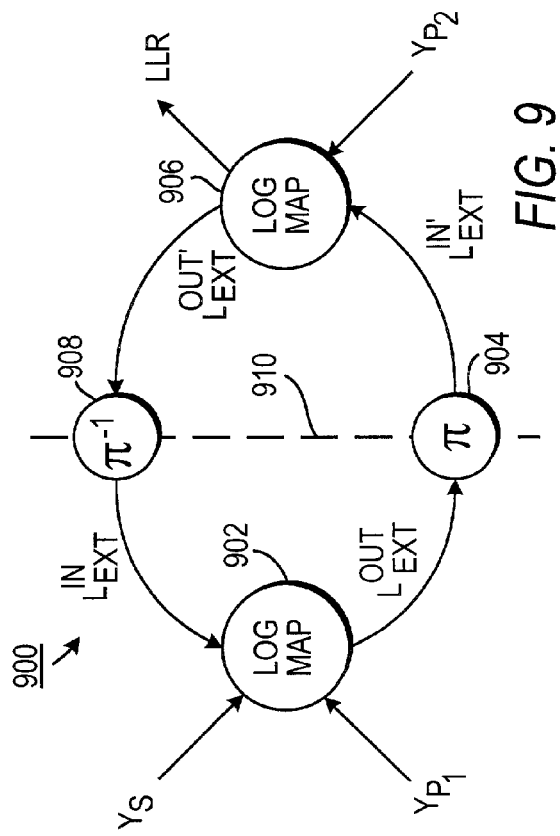
FIG. 9 show a block diagram of a turbo decoder implemented with Log MAP processors of the present invention.

Referring now to FIG. 9, turbo decoder 900 comprises LogMAP processors 902 and 906 constructed in accordance with the present invention. Turbo decoder 900 further comprises interleaver 904 and deinterleaver 908. Deinterleaver 908 performs a reverse interleaving operation. Received samples $Y_{P_1}$ and $Y_S$ are applied to LogMAP processor 902 and received sample $Y_{P_2}$ is applied to LogMAP processor 906 as shown. Turbo decoder 900 generates a Log Likelihood Ratio output. Interleaver 908, deinterleaver 904 and LogMAP processors 902 and 906 all share buffers and memory locations to retrieve and store extrinsic information. When the LogMAP processors process information as per Radix-4 trellis, the turbo decoder is able to decode 2 bits per unit time. For Radix-8, the turbo decoder is able to decode 3 bits per unit time and for Radix-16—4 bits per unit time. To ensure that multiple memory accesses can be done at the same time, a repetitive extrinsic information memory architecture is employed. The extrinsic information from the various components of the turbo decoder are stored in various memory blocks called extrinsic information memory.

In particular, for a Radix-4 turbo decoder, because two information bits are being processed per unit time, the turbo decoder retrieves relatively more information per unit time. Referring again to FIG. 9, boundary 910 symbolically represents the two memory spaces (for interleaver 904, deinterleaver 908 and the LogMAP processors) that are addressed differently. The side of boundary 910 where Log MAP processor 902 is located has memory for storing extrinsic information where such information is stored in memory having sequential memory addresses. In other words, the information that is to be retrieved is located is contiguous memory locations. However, because of the alteration in the time order of extrinsic information stored on the other side of boundary 910 (i.e., side where LogMAP processor 906 is located), the extrinsic information is not retrieved from sequential memory locations.

Unlike the sequential case where only one memory address need be known and the other memory address is simply the next higher address, two distinct memory addresses are used to retrieve the extrinsic information. The retrieval of information from two memory addresses in a sequential manner therefore reduces the speed of operation of the turbo decoder. To resolve this decrease in speed of operation, the extrinsic memory is replicated a certain number of times depending on the radix value of the turbo decoder. For example, for a Radix-4 turbo decoder, the extrinsic memory is duplicated. For a Radix-8 turbo decoder, there are three blocks of extrinsic memory with same addresses and same contents. In general, for a Radix-K turbo decoder there are $\log_2 K$ blocks of extrinsic information memory where all of them have the same addresses and the same contents stored at the addresses; that is, the extrinsic memory is replicated and corresponding memory addresses contain identical information at all times. In this manner multiple retrieval of extrinsic information can be done at a particular instant. Note that the multiple addresses generated can have the same value, but the actual values retrieved will be from different memory blocks. The replicated extrinsic information memories are independent of each other meaning that accessing information from one extrinsic memory does not, in any manner, affect any other extrinsic memory.

Figure 10:
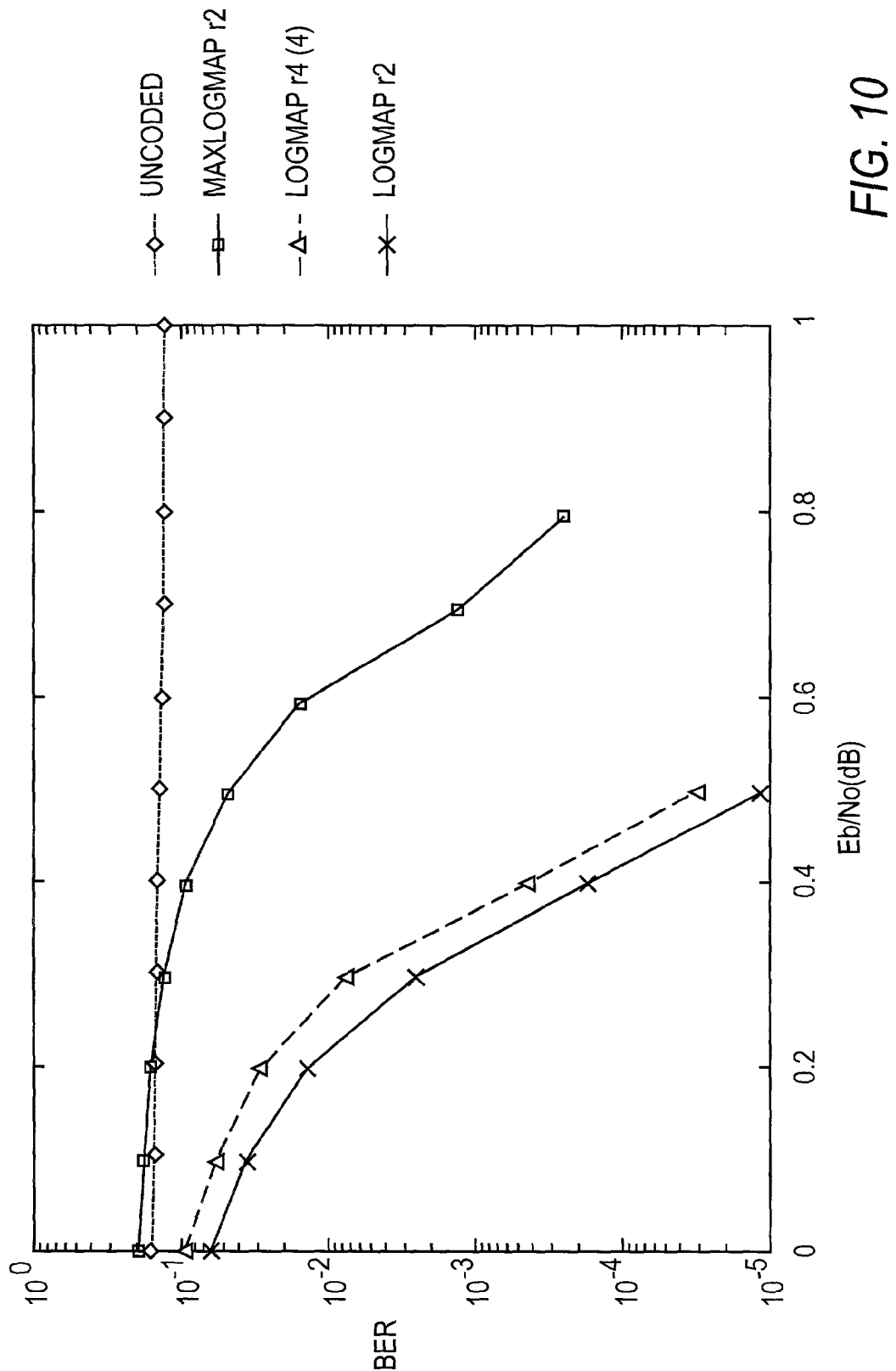
FIG. 10 is a chart showing the performance curves of a radix-2 turbo decoder and a radix-4 turbo decoder.

Referring now to FIG. 10 there is shown a performance comparison chart of a Radix-4 turbo decoder (constructed with LogMAP processors of the present invention) versus a Radix-2 turbo decoder. For an equal BER (say $10^{-3}$), the signal to noise ratio $$\left(\frac{E_b}{N_0}\right)$$

of the radix-4 turbo decoder is approximately 0.05 dB less than the signal to noise ratio of the radix-2 decoder. This difference in signal to noise ratio is negligible and for practical purposes is of very little or no significance. The negligible deterioration is due to the approximations made in the design of the PMCs. Therefore, for practical purposes, the radix-2 and radix-4 turbo decoders have virtually the same performance with the radix-4 turbo decoder being able to process information at a relatively faster rate.

We claim:

1. A processor comprising:
a device having at least one input for receiving at least one input signal and having at least one output where the device processes the received signal based on an N-state Radix-K trellis to produce at least one output signal where K is an integer equal to or greater than 4 and N is an integer equal to or greater than 2, and the device has at least one LogSum operator having a comparison circuit and a lookup table where the comparison circuit receives at least four branch and path metric summation and/or path metric inputs and selects a largest valued input and a value of one other input as two comparison outputs, and where the two comparison outputs are used to select a value from the lookup table for determining an approximation of a Jacobian definition of a LogSum operator.

2. The processor of claim 1 where the device is a LogMAP processor comprising a Soft Input Soft Output device that processes information in accordance with a LogMAP algorithm using a Radix-K N-state trellis where K is an integer equal to 4 or greater and N is an integer equal to 2 or greater.

3. The processor of claim 2 where the Soft Input Soft Output device comprises:
at least one branch metric calculator; at least one forward path metric calculator and at least one backward path metric calculator where both calculators are in communication with the branch metric calculator;
at least one Log Likelihood calculator coupled to the path metric calculators; and
at least one subtracter circuit having an extrinsic information input and coupled to the at least one Log Likelihood calculator to provide at least one Log Likelihood Ratio output wherein the path metric calculators and the at least one Log Likelihood calculator are constructed with LogSum operators which are designed based on an approximation of a Jacobian definition of a LogSum operation.

4. The processor of claim 3 where the extrinsic information input is obtained from a previous Log Likelihood Ratio calculation of the LogMAP processor.

5. The processor of claim 3 where the Logsum operators are constructed using an Add-Compare-Select architecture.

6. The processor of claim 3 where the at least one branch metric calculator is in communication with the at least one Log Likelihood calculator.

7. The processor of claim 3 where the calculated branch metrics for a defined time Window are stored in a memory device assigned to that time window and coupled to the at least one branch metric calculator.

8. The processor of claim 3 where there are N branch metric calculators, a total of log2 K path metric calculators and a total of log2 K Log Likelihood calculators.

9. The processor of claim 3 where the at least one Log Likelihood calculator has inputs arranged in at least one group where each group represents selected branch and path metric calculations that contribute to a particular log likelihood value.

10. The processor of claim 9 where the branch metrics are selected based upon information bit mappings associated with the associated particular log likelihood calculations, and only existing path metric results are used.

11. A method of processing information using LogMAP algorithm, the method comprises the step of:
providing an N-state Radix-K processing guide on which the application of the information to the LogMAP algorithm is based where K is an integer equal to 4 or greater and N is an integer equal to 2 or greater, and the method has at least one LogSum operator having a comparison circuit and a lookup table where the comparison circuit receives at least four branch and path metric summation and/or path metric inputs and selects a largest valued input and a value of one other of the inputs as two comparison outputs, and where the two comparison outputs are used to select a value from the lookup table for determining an approximation of a Jacobian definition of a LogSum operator.

12. The method of claim 11 where the step of providing an N-state Radix-K procedure comprises the steps of:
receiving the information;
calculating branch metrics based on the received information and extrinsic information;
calculating path metrics based on the calculated branch metrics;
calculating log likelihood values from the branch metrics and path metrics where the calculated log likelihood value and the calculated path metrics are obtained through logsum operations based on an approximation of a Jacobian definition; and
calculating a log likelihood ratio through a subtraction operation of the calculated log likelihood values and extrinsic information.

13. A turbo decoder for decoding information, the turbo decoder comprising:
a first SISO device and a second SISO device both of which process information in accordance with a LogMAP algorithm based on an N-state Radix-K trellis where N is an integer equal to 2 or greater and K is an integer equal to 4 or greater where the SISO devices are coupled to an interleaver and a deinterleaver, and where each SISO device has at least one LogSum operator having a comparison circuit and a lookup table where the comparison circuit receives at least four branch and path metric summation and/or path metric inputs and selects a largest valued input and a value of one other of the inputs as two comparison outputs, and where the two comparison outputs are used to select a value from the lookup table for determining an approximation of a Jacobian definition of a LogSum operator.

14. The turbo decoder of claim 13 where the SISO devices, the interleaver and deinterleaver have $\log_2 K$ replicated memory blocks for storing extrinsic memory information.

* * * * *